(12) United States Patent
Grodzki et al.

(10) Patent No.: US 10,156,622 B2
(45) Date of Patent: Dec. 18, 2018

(54) METHOD AND APPARATUS FOR SECTIONAL OPTIMIZATION OF RADIAL MR PULSE SEQUENCES

(71) Applicant: SIEMENS HEALTHCARE GMBH, Erlangen (DE)

(72) Inventors: David Grodzki, Erlangen (DE); Thorsten Speckner, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 98 days.

(21) Appl. No.: 15/452,946

(22) Filed: Mar. 8, 2017

(65) Prior Publication Data
US 2017/0261583 A1    Sep. 14, 2017

(30) Foreign Application Priority Data

Mar. 8, 2016    (DE) .......................... 10 2016 203 757

(51) Int. Cl.
*G01V 3/00* (2006.01)
*G01R 33/54* (2006.01)
*G01R 33/48* (2006.01)

(52) U.S. Cl.
CPC ....... *G01R 33/543* (2013.01); *G01R 33/4824* (2013.01)

(58) Field of Classification Search
CPC .................................................. G01R 33/4824

USPC .......................................... 324/309, 307, 306
See application file for complete search history.

(56) References Cited

U.S. PATENT DOCUMENTS

| 7,548,062 | B1 | 6/2009 | Gurney | |
|---|---|---|---|---|
| 9,317,917 | B2 * | 4/2016 | Stemmer | G06T 7/0012 |
| 9,921,285 | B2 * | 3/2018 | Otazo | A61B 5/055 |
| 2008/0265885 | A1 | 10/2008 | Dannels | |
| 2008/0284439 | A1 | 11/2008 | Xu et al. | |
| 2013/0271139 | A1 * | 10/2013 | Grodzki | G01R 33/543 |
| | | | | 324/314 |
| 2015/0212179 | A1 | 7/2015 | Overall et al. | |
| 2016/0274209 | A1 * | 9/2016 | Dannels | G01R 33/4824 |
| 2017/0307711 | A1 * | 10/2017 | Wundrak | G01R 33/4824 |

FOREIGN PATENT DOCUMENTS

DE    10 2012 205 864 A1    10/2013

* cited by examiner

*Primary Examiner* — Louis Arana
(74) *Attorney, Agent, or Firm* — Schiff Hardin LLP

(57) ABSTRACT

In a method, magnetic resonance apparatus, and pulse optimization computer for determining a pulse sequence for radial sampling of k-space in magnetic resonance imaging, the amplitudes and the increases with respect to time of readout gradients and phase gradients for individual sections of k-space are determined depending on an orientation of the respective section in k-space and depending on global maximum values of the amplitudes and the increases of the gradients on the physical axes.

13 Claims, 6 Drawing Sheets

METHOD AND APPARATUS FOR SECTIONAL OPTIMIZATION OF RADIAL MR PULSE SEQUENCES

BACKGROUND OF THE INVENTION

Field of the Invention

The invention concerns a method for determining a pulse sequence for radial sampling (data entry into) of k-space in the context of magnetic resonance imaging. The invention further relates to a magnetic resonance imaging method and a pulse sequence optimization computer. Furthermore, the invention relates to a magnetic resonance imaging apparatus.

Description of the Prior Art

Modern imaging methods are often used to generate two-dimensional or three-dimensional image data, which can be used to visualize an examination object that is being depicted, and as well as for further applications.

In a magnetic resonance installation, also known as a magnetic resonance tomography apparatus, the body to be examined is usually exposed to a relatively high basic magnetic field, e.g. 1, 3, 5 or 7 Tesla, by a basic field magnet in the scanner of the apparatus. In addition, a magnetic field gradient is applied by a gradient system of the scanner. Radio-frequency excitation signals (RF signals) are then radiated by a radio-frequency transmitting system using suitable antennas in order to tip the nuclear spins of specific atoms, which are resonantly excited by this radio-frequency field, by a defined flip angle relative to the magnetic field lines of the basic magnetic field. During the relaxation of the nuclear spins, radio-frequency signals (called magnetic resonance signals) are emitted and are received by suitable receiving antennas, and then processed further. The desired image data can then be reconstructed from the raw data acquired in this manner.

For a specific measurement, it is necessary to emit a specific pulse sequence in the scanner comprised of a series of radio-frequency pulses, in particular excitation pulses and refocusing pulses, and suitable gradient pulses, which are emitted in a coordinated manner, in various spatial directions. Readout windows must also be set in a temporally suitable manner, so as to specify time periods in which the induced magnetic resonance signals are captured. In this case, the imaging is influenced by the timing within the sequence, i.e. the temporal intervals at which the pulses follow each other. A number of control parameters are usually defined in a measurement protocol, which is created in advance and is retrieved for a specific measurement, e.g. from a storage entity, and may be modified on site by the operator. The operator can specify additional control parameters such as a specific slice spacing of a stack of slices to be measured, a slice thickness etc. A pulse sequence, also known as a measurement sequence, is then calculated on the basis of all these control parameters.

The gradient pulses are defined by their gradient amplitude, the time duration of the gradient pulse, and the steepness of the edge, or the first time derivative of the pulse waveform (dG/dt) of the gradient pulses, also referred to as the "slew rate". A further important gradient pulse variable is the gradient pulse moment (also shortened to "moment"), which is defined by the integral of the amplitude over time.

The magnetic gradient coils by which the gradient pulses are emitted are switched frequently and rapidly during a pulse sequence. Since the time specifications within a pulse sequence are usually very strict and the total duration of a pulse sequence, which defines the total duration of an MRT examination, must also be kept as short as possible, gradient strengths of approximately 40 mT/m and slew rates of up to 200 mT/m/ms must be achieved in some cases. The strength of the gradients results in a higher energy consumption and also places higher demands on the gradient coils and the other hardware. Since the hardware has a maximum load limit, the gradient strength and the increase of the gradients (slew rate) are generally limited.

In the case of magnetic resonance imaging, direct image recording (acquisition) does not take place in the spatial domain, rather magnetic resonance signals are acquired that have an amplitude that can be transformed into the spatial domain by a Fourier transform of the image data entered into k-space. K-space is the positional frequency space of the density distribution of the magnetic moments in an examination region in which MR signals are recorded. Once k-space has been sufficiently sampled (filled with acquired data), a Fourier transformation (which is two-dimensional when sampling by slice) produces the spatial distribution of the density of the magnetic moments (image data). During the measurement (scan), k-space is filled with raw data that correspond to the acquired magnetic resonance signals. In this case, lines in a Cartesian grid of k-space are usually sampled consecutively. This generally has the advantage that any shifts in the measured lines are identical for every k-space line. This coherent shifting results in a phase offset of the image data. Since only the magnitudes of the image signals are considered in most image recordings, this phase offset no longer occurs in the representation in the spatial domain of the image data. Therefore, this type of k-space sampling is very robust.

K-space can also be filled with raw data using other sampling patterns (paths), called trajectories. For example, sampling of k-space can take place using a radial or spiral trajectory. These sampling patterns each have specific advantages and disadvantages.

Although conventionally most MR image recordings are made using Cartesian trajectories in the past, radial MR imaging is growing in importance. The advantage of MR imaging using a radial trajectory is its particularly robust nature with respect to artifacts caused by movement. This property is particularly relevant, for example, if an MR image recording is made in the chest region of a breathing patient. Radial MR imaging is also suitable for rapid image recordings since it responds robustly to undersampling, and therefore less k-space data need to be captured, without artifacts becoming noticeable in the image recording. However, radial MR imaging is vulnerable to possible shifts of the radial trajectories in k-space, e.g. resulting from minimal time delays.

In the context of MR imaging with radial k-space sampling, usually data for a different radially extending "spoke" through k-space are acquired with each repetition of the excitation/readout portion of the sequence, each spoke being tilted, e.g. by an angle Ω, relative to the physical axes of the magnetic resonance scanner. The physical axes of the magnetic resonance scanner correspond e.g. to the orientation of the coils of the gradient system. The longitudinal orientation of the basic magnetic field usually corresponds to the z-direction, the lateral direction corresponds to the x-direction, and the anterior-posterior direction corresponds to the y-direction.

For simplicity, an imaging method with slice-by-slice radial sampling of k-space ("stack of stars") is described in the following. However, the following considerations also apply in principle to three-dimensional radial sampling of k-space.

In order to allow the MR signals in k-space to be read out in the radial direction, readout gradients Gr are generated in the radial direction with amplitudes $G_R$, and phase gradients Gp are generated perpendicularly thereto in the phase direction, with amplitudes $G_P$, during the readout of the MR signals. In this context, the direction of the readout gradients Gr and the direction of the phase gradients Gp are designated as logical axes. FIG. 1 shows a pulse sequence having such a pulse pattern, wherein the readout gradient Gr extends in the direction of the x-axis here and the phase gradient Gp is oriented in the direction of the y-axis. The x-axis and the y-axis are designated as physical axes in this context. Unlike the logical axes, the physical axes are fixed. FIG. 1 shows a snapshot of k-space sampling. Specifically, the readout gradient Gr corresponds in this situation to a gradient Gx in an x-direction with the amplitude $G_x$, and the phase gradient Gp corresponds in this situation to a gradient Gy in a y-direction with the amplitude $G_y$.

At the next repetition, the readout gradient Gr and the phase gradient Gp are rotated in each case by the angle $\Omega = \Omega_s$, i.e. the angle $\Omega_s$ between two k-space spokes or radial k-space trajectories, such that the amplitudes $G_x$, $G_y$, $G_R$, $G_P$ of the gradients Gx, Gy, Gr, Gp are as follows:

$$G_x = -\sin\Omega_s \cdot G_R + \cos\Omega_s \cdot G_P, \quad (1)$$

$$G_y = \cos\Omega_s \cdot G_R + \sin\Omega_s \cdot G_P. \quad (2)$$

In order to ensure that the maximum permitted physical values of the gradients Gx, Gy in the x-direction and the y-direction, in particular their amplitude $G_x$, $G_y$ and their increase $dG_x/dt$, $dG_y/dt$ are not exceeded in any repetition, i.e. at any angle $\Omega$, the values that are used in the entirety of the pulse sequence for the amplitude $G_R$, $G_p$ and the increase $dG_R/dt$, $dG_p/dt$ of the logical gradients Gr, Gp are customarily limited such that the cited condition is satisfied at all times, i.e. for all angles $\Omega$. This means that the amplitudes $G_R$, $G_p$ of the logical gradients Gr, Gp are selected such that the cited maximum values of the amplitudes $G_x$, $G_y$ and the increases $dG_x/dt$, $dG_y/dt$ are not exceeded at the angle $\Omega_w$, at which $G_P$ and $G_R$ are structurally superimposed on a physical axis. As a result of this global limitation relating to the gradient parameters of the logical gradients, minimal possible imaging parameters, e.g. the echo time $T_E$ and the repetition time $T_R$, are significantly limited in a downwards direction, i.e. toward shorter times. In the case of many applications, particularly in the case of dynamic imaging or live imaging, it is desirable to set the values of the cited imaging parameters as low as possible.

SUMMARY OF THE INVENTION

In the context of the above-described conventional MR imaging, a problem arises to reduce the values of the imaging parameters without exceeding the limit values for the gradient strength and the increase of the gradients.

In the inventive method for determining a pulse sequence for radial sampling of k-space in the context of magnetic resonance imaging, the amplitudes and the increases of readout gradients and phase gradients for individual sections of k-space are established depending on an orientation of the respective section in k-space and depending on global maximum values of the amplitudes and the increases of the gradients on the physical axes. An orientation of the respective section in k-space is understood in this context, in the case of a radial sampling, to be a direction in which the respective section of k-space is situated, in particular an angle that specifies this direction relative to a reference direction, e.g. one of the two physical axes. However, the global maximum values do not apply on a section-by-section basis in this case, but apply equally to all of the sections to be sampled. The global maximum values are based on power restrictions and/or load restrictions of the magnetic resonance imaging system being used, and are usually fixed. The global maximum values can also include limitations with respect to the exposure of the patient. Unlike the global maximum values of the amplitudes and the increases of the gradients on the physical axes, the permitted maximum values of the amplitudes and the increases of the gradients on the logical axes vary from section to section. According to the invention, different values for the amplitudes and the increases of readout gradients and phase gradients are therefore established for each section.

By virtue of the section-by-section adaptation, the maximal possible physical restrictions for each section can be better utilized than previously, or even fully utilized. In this way, as a result of the higher values that are therefore possible for amplitudes and increases of readout gradients and phase gradients, shorter repetition times and shorter echo times, can be selected for the pulse sequences to be emitted during the magnetic resonance imaging. Shorter repetition times allow faster measurements, for example, this, being advantageous in particular when depicting dynamic processes and in the case of so-called live pictures. Shortened echo times are associated with shorter $T_2^*$ decay times, whereby higher signal strengths can be achieved due to the reduced relaxation. It is thereby possible to obtain pictures having an improved signal/noise ratio or to depict finer contrasts, for example. Conversely, if the echo time is preserved, the possibility of emitting shorter gradient pulses also means that higher resolutions can be achieved, since more time remains for sampling k-space within a repetition.

The inventive pulse sequence has a number of pulse sub-sequences, also referred to as repetitions, that each include:

at least one RF excitation pulse,
at least one readout gradient in readout direction and
at least one phase gradient in phase direction, wherein the gradient amplitudes and the increases of the gradients on the logical axes are established for individual sections of k-space depending on an orientation of the respective section in k-space and depending on global maximum values of the gradient amplitudes and the increases of the gradients on the physical axes.

In the inventive magnetic resonance imaging method, a pulse sequence is initially generated by the inventive method for determining a pulse sequence for radial sampling of k-space in the context of magnetic resonance imaging. An examination region of an examination object is then excited by the pulse sequence that has been generated, and magnetic resonance signals are captured. Finally, image data are reconstructed on the basis of the captured magnetic resonance signals (the raw data) resulting therefrom.

The inventive pulse sequence optimization computer has an input interface for receiving global maximum values of gradient amplitudes and increases of gradients on the physical axes, for a pulse sequence that is to be optimized. The computer further has a pulse sequence optimization processor that determines the gradient amplitudes and the increases of the gradients on the logical axes for individual sections of k-space depending on an orientation of the respective section in k-space and depending on the received global maximum values. The inventive pulse sequence optimization computer has an output interface from which the values that have been determined for the gradient amplitudes and the increases of the gradients on the logical axes, are emitted as electronic signals. The pulse sequence optimization computer can be part of a control computer of a magnetic resonance installation, for example, but can also be integrated in another unit separately.

The inventive magnetic resonance imaging apparatus has a radio-frequency transmitting system, a gradient system and a control computer. The control computer is designed to activate the radio-frequency transmitting system and the gradient system in order to perform a desired measurement on the basis of a specified pulse sequence. The inventive magnetic resonance imaging system further has an inventive pulse sequence optimization computer that provides the optimized pulse sequence described above to the control computer for operation of the scanner of the apparatus.

The basic components of the inventive pulse sequence optimization computer can be designed primarily in the form of software components. This relates in particular to the pulse sequence optimization processor, but also to interfaces of the pulse sequence optimization processor and to other components of the pulse sequence optimization processor described above. In principle, however, these components can also be realized in the form of software-assisted hardware in some cases, e.g. FPGAs or similar, in particular when particularly fast calculations are involved. The required interfaces can likewise be designed as software interfaces, e.g. if only transfer of data from other software components is involved. However, they can also be designed as hardware-based interfaces which are activated by suitable software.

The inventive pulse sequence optimization computer can be part of a user terminal of an MR system or part of software installed therein.

A largely software-based implementation has the advantage that magnetic resonance imaging systems already in use can be upgraded easily by a software update, in order to function in the inventive manner. The invention thus also encompasses a non-transitory, computer-readable data storage medium encoded with programming instructions (code) that can be loaded directly into a memory of a control computer of a magnetic resonance tomography system. The program code causes all steps of the inventive method to be executed in the magnetic resonance imaging system by operation of the control computer.

The computer-readable medium can be a memory stick, hard disk or other transportable or permanently installed data medium, on which the aforementioned code is stored.

In an embodiment of the inventive method, the maximal possible values are determined for the gradient amplitudes and the increases of the gradients on the logical axes. In other words, the highest possible values compatible with the respective physical restrictions are determined for the gradient amplitudes and the increases of the gradients on the logical axes. Such a procedure makes it possible, for example, to reduce the repetition time and therefore to implement faster imaging processes, which are suitable for the imaging of dynamic processes in particular. Furthermore, it is thereby also possible to shorten echo times to a minimum, which in conjunction with minimal possible $T_2^*$ decay times, results in maximal possible signal strengths. Conversely, if the echo time is preserved, the possibility of emitting gradient pulses of optimum temporal shortness means that optimally high resolutions can also be achieved, since an optimally lengthened time remains for sampling k-space within a repetition.

An individual section in k-space preferably contain data acquired in number of repetitions in each case. For example, an individual section in this case contains multiple radially extending trajectories, which are oriented in different directions at different angles in k-space. If a number of such sections are combined when determining a pulse sequence, the calculation effort and the calculation time required to determine an optimized pulse sequence can be reduced.

Alternatively, the individual sections can each contain data acquired in exactly one repetition. For example, a section then contains only a single radially extending trajectory in each case, the trajectories of different sections being oriented in different directions at different angles in k-space. The values for the gradient amplitudes and the increases of the gradients on the logical axes can be maximized in this way, since they can be adapted in each case to the individual constellation of the superimposition of the phase gradients and the readout gradients for an individual repetition, without having to take other repetitions into consideration.

In a preferred embodiment of the inventive method a best possible angle of a radial k-space trajectory is determined, at which the gradients are destructively superimposed on the logical axes and are optimally distributed on the physical axes. The best possible angle is also referred to as the optimum angle in the following. In this embodiment, the gradient amplitudes and the increases of the gradients on the logical axes for a radial k-space trajectory are then determined that the best possible angle. Finally, individual gradient amplitudes and individual increases of the gradients on the logical axes are established for the other radial k-space trajectories, such that the global maximum values are not exceeded. In other words, that section of k-space is sought in which the values for the amplitudes and increases of the readout gradients and phase gradients can have the highest values. Conversely, this procedure allows sequence parameters such as the echo time and the repetition time to be reduced to a minimum in comparison with the conventional approach. If these values were now simply transferred to the other sections or trajectories having different angles, the maximum permitted values of the amplitudes and increases of the gradients on the physical axes would be exceeded in those sections. Therefore in this embodiment, an individual adaptation of the gradient amplitudes and increases of the gradients on the logical axes is effected for the other radial k-space trajectories, in such a way that the global maximum values are not exceeded.

In the inventive method, individual gradient amplitudes and individual increases are preferably established such that the entire radial k-space trajectory is fully sampled only for the repetition having the best possible angle, and only part of the associated k-space trajectory is sampled for the other repetitions having other trajectory angles. In this embodiment, the adaptation in the other sections, i.e. those sections that are assigned a trajectory angle other than the best possible angle, is performed such that the length of the individual trajectories is shortened in comparison with the trajectory which is assigned the best possible angle. K-space area that can be sampled using given time parameters of a pulse sequence is thereby maximized. Conversely, if k-space area to be sampled remains the same, the time parameters of the pulse sequence used can be reduced, thereby contributing to the cited advantages with respect to the image quality and the recording duration.

In a further embodiment of the inventive method, the pulse sequence is configured such that, for the other repetitions having other trajectory angles, only the inner rectangle of an annularly extending k-space or k-space section is sampled. In comparison with conventional sampling of k-space, assuming identical echo times and repetition times for illustration, instead of sampling an inner circle of k-space (see FIG. 3), a k-space rectangle is sampled that contains the inner circle, e.g. a k-space square (see FIG. 3), which contains a larger k-space area than the inner circle. Conversely, in the case of a sampled k-space area of the same size, which corresponds approximately to a constant resolution, it is possible to shorten the time parameters of the pulse sequence, e.g. the echo time or the repetition time, resulting in the previously cited advantages for the magnetic resonance imaging.

In the inventive method, the pulse sequence is most preferably configured such that, for the other repetitions having other trajectory angles, sampling starts at the edge of the inner rectangle of k-space, and remaining k-space is fully sampled in the direction of the respective k-space trajectory. In this case, adjacent k-space trajectories are sampled alternately in opposite directions. This procedure is beneficial if relatively little time remains in a pulse sequence between the phase gradients and readout gradients and the echo time point, in comparison with the time period after the echo time point. In such cases, the time intervals for the sampling of k-space are therefore distributed asymmetrically. This particular circumstance is utilized in this variant to the effect that a shorter trajectory path, specifically the trajectory proceeding from the edge of k-space rectangle to k-space center, is sampled in a time duration before the echo time point, and a longer trajectory path, specifically the trajectory proceeding from k-space center to the outer edge of k-space, is sampled after the echo time point. On the basis of the alternating sampling for adjacent trajectories, methods such as partial Fourier can be used to reconstruct the missing raw data, thereby making it possible to significantly reduce any possible quality loss in the image due to the omission of data in partial regions of k-space, resulting from the asymmetrical sampling.

The invention also encompasses a method wherein an optimized pulse sequence is determined using the above-described method for determining a pulse sequence for radial sampling of k-space wherein, for the other repetitions having other trajectory angles, sampling starts at the edge of the inner rectangle of k-space, and remaining k-space is fully sampled in the direction of the respective k-space trajectory, and adjacent k-space trajectories are sampled alternately in opposite directions.

Using this embodiment, the reconstruction of image data is preferably effected by a partial Fourier transformation technique (also known as a partial Fourier reconstruction).

DESCRIPTION OF THE PREFERRED EMBODIMENTS

Figure 1:
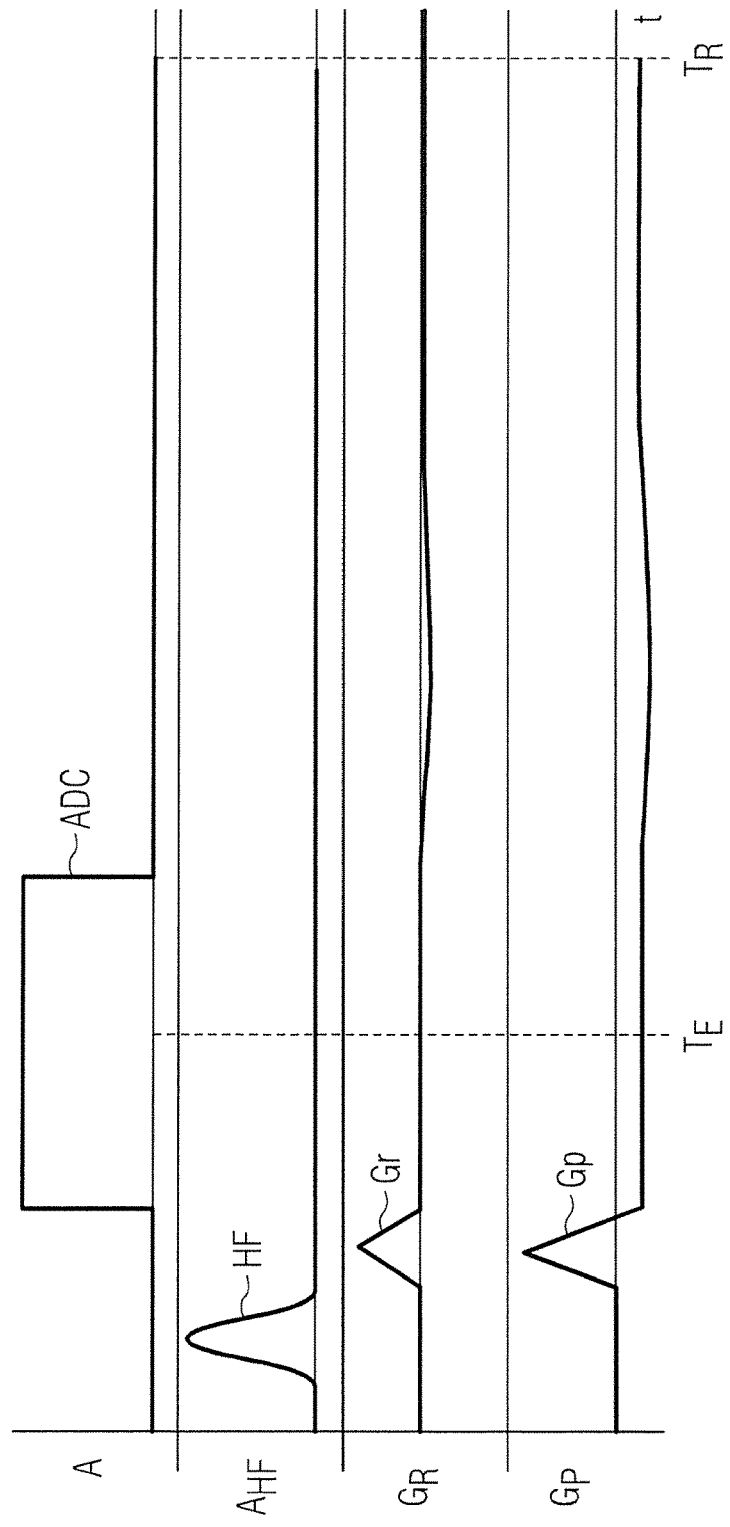
FIG. 1 shows a pulse sequence diagram that illustrates a gradient echo sequence with radial sampling.

FIG. 1 shows a pulse sequence diagram that has four lines and shows a section of a gradient echo pulse sequence, referred to as a repetition, for the radial magnetic resonance imaging. In the pulse sequence diagram, the amplitude A of the pulse is plotted over time t in each case. A readout window is shown in the first line. Magnetic resonance signals can be captured during a rectangular readout pulse ADC. An RF excitation pulse RF having an amplitude $A_{RF}$ is shown in the second line, this pulse being emitted at the start of the pulse sequence section and resulting in a precession of magnetic moments in an examination region of an examination object. The third line of the pulse sequence diagram illustrates a readout gradient Gr and the profile of its amplitude $G_R$, this gradient causing k-space to be sampled in a radial direction. The fourth line illustrates a phase gradient Gp and the profile of its amplitude $G_P$. This gradient establishes the phase or the associated angle Ω in k-space at which the trajectory extends for the radial sampling of k-space in each case. In the case of the repetition shown in FIG. 1, the direction of the readout gradient Gr coincides with the x-axis and the direction of the phase gradient Gp coincides with the y-axis. This means that the trajectory angle Ω has the value 0, the amplitude of the gradients in the x-direction $G_x$ corresponds to the amplitude $G_R$ of the readout gradient Gr and the amplitude of the gradients $G_y$ in the y-direction corresponds to the amplitude $G_P$ of the phase gradient Gp. The x-axis and the y-axis correspond to the physical axes of the scanner of the magnetic resonance imaging system in this case. As noted above, a general relationship is produced between the amplitudes $G_R$, $G_P$ of the logical gradients Gr, Gp and the amplitudes $G_x$, $G_y$ of the physical gradients Gx, Gy per the equations 1, 2.

Pulse sequences for segmented radial sampling of k-space, e.g. the radial turbo-spin echo sequence (BLADE) in which consecutively recorded k-space segments are rotated by an angle $Ω_s$, are a similar type of pulse sequence.

Figure 2:
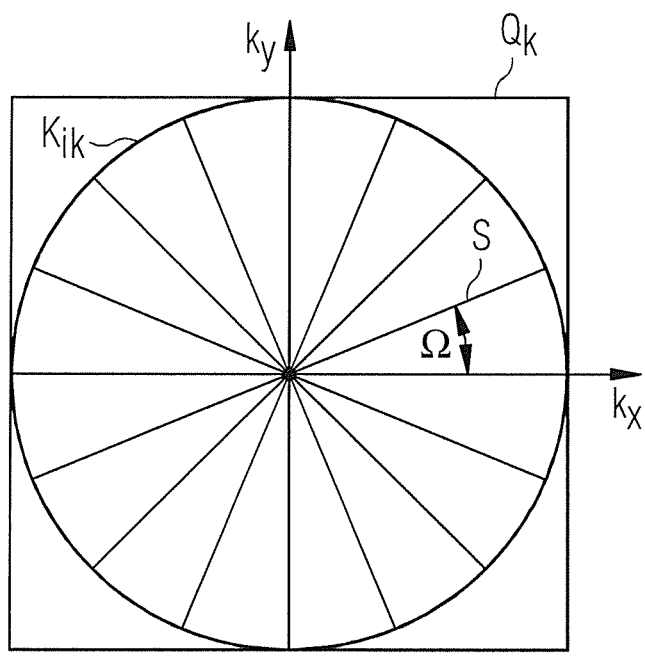
FIG. 2 shows a sampling pattern of k-space with radial trajectories.

FIG. 2 illustrates sampling of k-space in the radial direction. In the case of a conventional pulse sequence, the lengths of the trajectories S in the radial direction are limited by the maximum gradient amplitudes $G_x$, $G_y$ in the x-direction and the y-direction. The length of the corresponding trajectory S corresponds to one half of the diameter of k-space square $Q_k$ designated in FIG. 2. Since the amplitudes of the logical gradients Gp, Gr are conventionally invariable over the whole pulse sequence, a conventional pulse sequence only samples the inner k-space circle $K_{ik}$ drawn in FIG. 2. K-space regions situated outside this inner circle $K_{ik}$ are not taken into account. The restriction of the gradient parameters at the least favorable angle Ω=0 of the trajectory S therefore establishes the minimal possible time parameters, e.g. the echo time $T_E$ and the repetition time $T_R$. It is therefore conventionally the case that, due to the global restriction of the values of the amplitudes and increases of the logical gradients Gp, Gr, the values of the sequence parameters are also restricted in a downward direction, this can be disadvantageous in the case of dynamic imaging in particular.

Figure 3:
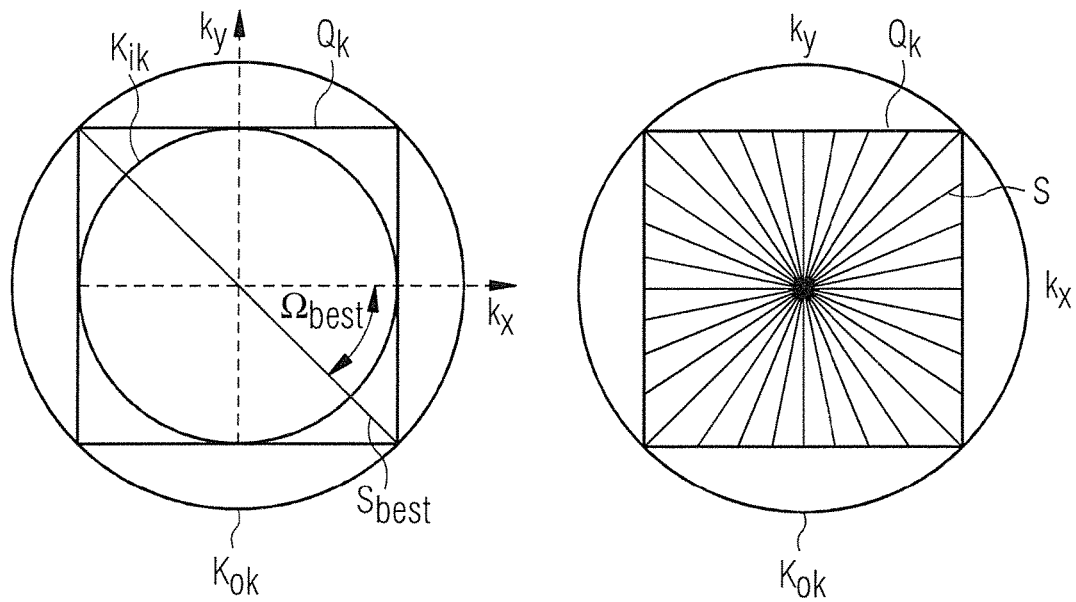
FIG. 3 shows a sampling pattern of k-space according to an exemplary embodiment of the invention.

FIG. 3 shows a sampling pattern of k-space according to an exemplary embodiment of the invention, in which the restriction illustrated in FIG. 2 of the sampling in k-space circle $K_{ik}$ drawn in FIG. 2 is overcome. In the left drawing part, a trajectory $S_{best}$ having the optimum angle $\Omega_{best}$ is drawn through k-space, where the physical gradients Gx, Gy are destructively superimposed, and therefore at this optimum angle $\Omega_{best}$ the amplitudes $G_R$, $G_P$ of the logical gradients Gr, Gp can assume the highest possible values without the physical restrictions of the MR system being exceeded. These maximum values of the logical gradients in turn allow the selection of particularly short echo times $T_E$ and repetition times $T_R$, and therefore a pulse sequence $P_{opt}$ that is developed according to FIG. 3 is particularly suitable for dynamic imaging. In order to ensure that the physical restrictions are also not exceeded for other angles $\Omega$ of the other trajectories, the lengths of the other trajectories S as illustrated in the right drawing part are restricted to the dimensions of a k-space square $Q_k$ whose diagonal corresponds precisely to the trajectory $S_{best}$ having the optimum angle $\Omega_{best}$. This means that if echo time $T_E$ and repetition time $T_R$ remain constant, the amplitudes $G_R$, $G_P$ of the logical gradients Gr, Gp are reduced, in comparison with the amplitudes $G_{R\_max}$, $G_{P\_max}$ on the trajectory $S_{best}$ having the optimum angle $\Omega_{best}$, depending on the angle $\Omega$ of the trajectory S that is sampled in each case, such that k-space square $Q_k$ marked in the right drawing part is effectively sampled. In this way, for a comparable size of the sampled k-space area, the values of the imaging parameters $T_E$, $T_R$ can be reduced in comparison with the method illustrated in FIG. 2, without contravening the cited physical restrictions. However, it must be accepted in the described method that the resolution is somewhat reduced for certain angles $\Omega$, since sampling over the full length only takes place in the direction of the diagonals of k-space square $Q_k$. However, the resolution for other angles $\Omega$, e.g. the diagonals $\Omega_{best}$, is again somewhat better than in the case of the conventional sampling in is FIG. 2.

Figure 4:
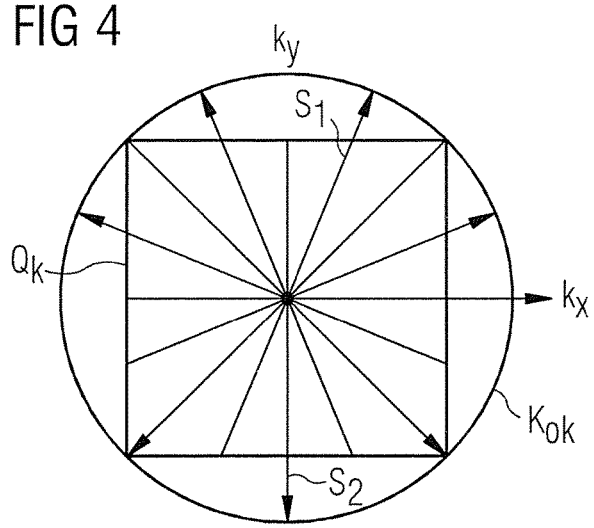
FIG. 4 a sampling pattern of k-space according to an alternative exemplary embodiment of the invention.

FIG. 4 shows a sampling pattern of k-space according to an alternative exemplary embodiment of the invention. In this variant, k-space is sampled asymmetrically but at least partially to full extent, while the contrast-determining echo time $T_E$ is nonetheless held constant over different angles $\Omega$. In this case, the sampling starts on a trajectory $S_1$, for example, from the edge of k-space square $Q_k$ and then continues as far as the edge of the outer k-space circle $K_{ok}$ which is likewise drawn in FIG. 4. The sampling takes place in an alternating manner, i.e. in an opposite direction (see trajectory S2) from repetition to repetition, which allows sampling with partial Fourier. Missing points of a trajectory in k-space, i.e. regions which were not sampled by the respective trajectory $S_1$, $S_2$, can either be omitted by zero filling, or estimated or calculated by methods such as POCS (POCS=projection onto convex set) or compressed sensing.

The positioning and the length of k-space trajectories $S_1$, $S_2$ can be set, for example, depending on the nature of the time intervals between the logical gradients and the readout window ADC and thereafter until the end of a repetition. For example, in the case of a shortened sampling time window before the readout window ADC, the trajectory $S_1$ as shown in FIG. 4 can be shortened in respect of its part extending toward k-space center, whereas that part of the trajectory $S_1$ extending away from k-space center is fully developed. As mentioned above, combinations and/or mixtures of the methods illustrated in FIG. 3 and FIG. 4 are possible.

Figure 5:
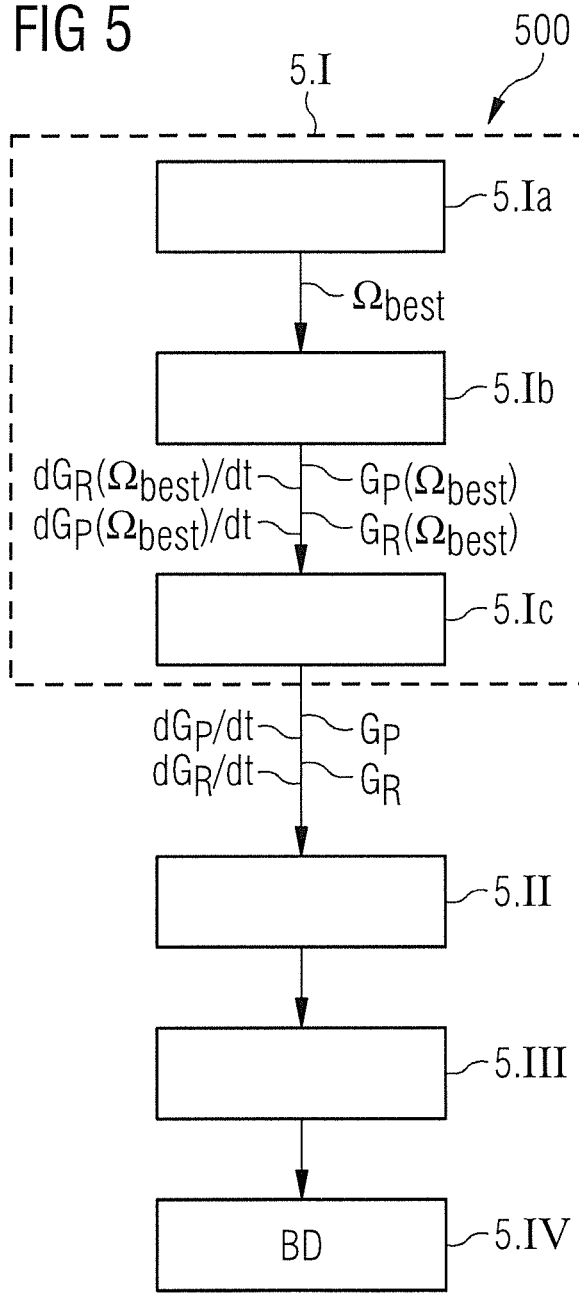
FIG. 5 is a flowchart that illustrates a magnetic resonance imaging method according to an exemplary embodiment of the invention.

FIG. 5 is a flowchart 500 that illustrates a magnetic resonance imaging method according to an exemplary embodiment of the invention. In the step 5.I, a pulse sequence $P_{opt}$ is generated or optimized by means of a method for determining a pulse sequence for radial sampling of k-space. Specifically, in the step 5.Ia, a best possible angle $\Omega_{best}$ of a radial k-space trajectory $S_{best}$ is determined, at which the gradients Gr, Gp are destructively superimposed on the logical axes and optimally distributed on the physical axes x, y. Following thereupon, in the step 5.Ib the gradient amplitudes $G_R$, $G_P$ and the increases $dG_R/dt$, $dG_P/dt$ of the gradients Gr, Gp on the logical axes are determined for a radial k-space trajectory $S_{best}$ having the best possible angle $\Omega_{best}$. Finally, in the step 5.Ic, individual gradient amplitudes $G_R$, $G_P$ and individual increases $dG_R/dt$, $dG_P/dt$ of the gradients Gr, Gp on the logical axes are established for the other radial k-space trajectories S, $S_1$, $S_2$ in such a way that the global maximum values $G_{x\_max}$, $G_{y\_max}$, dGx_max/dt, dGy_max/dt are not exceeded.

Thereafter, in the step 5.II of the magnetic resonance imaging method, a region to be examined FOV of an examination object O is excited by the generated pulse sequence $P_{opt}$ for transmitting magnetic resonance signals. The excited magnetic resonance signals are captured in the next step 5.III, and image data BD are finally reconstructed in the step 5.IV on the basis of the captured magnetic resonance signals.

Figure 6:
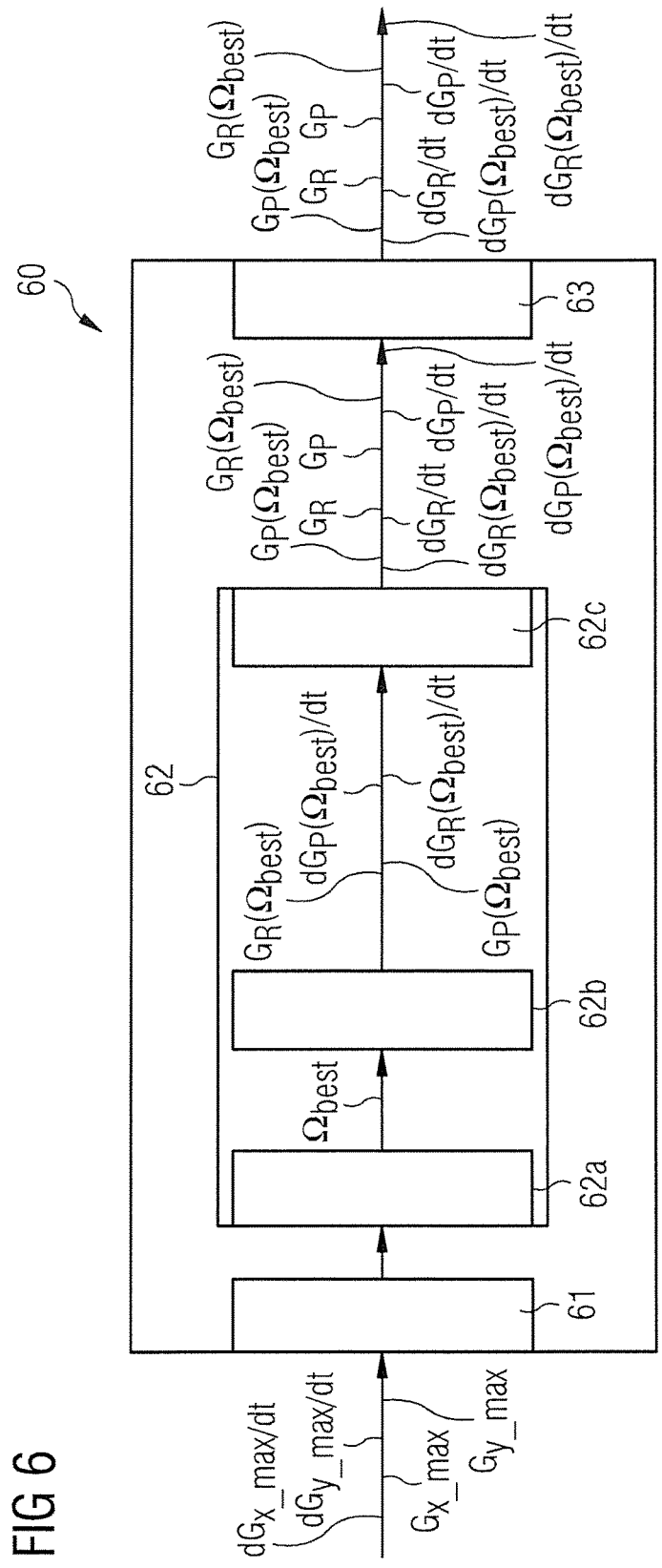
FIG. 6 is a block diagram that illustrates a pulse sequence optimization device according to an exemplary embodiment of the invention.

FIG. 6 illustrates a pulse sequence optimization computer 60 according to an exemplary embodiment of the invention. The pulse sequence optimization computer 60 has an input interface 61. The input interface 61 is used to receive global maximum values $G_{x\_max}$, $G_{y\_max}$, dGx_max/dt, dGy_max/dt of gradient amplitudes $G_x$, $G_y$ and increases $dG_x/dt$, $dG_y/dt$ of gradients Gx, Gy on the physical axes, for a pulse sequence P that is to be optimized. The cited maximum values $G_{x\_max}$, $G_{y\_max}$, dGx_max/dt, dGy_max/dt are then transferred to a pulse sequence optimization processor 62, with is likewise part of the pulse sequence optimization computer 60. In this processor 62, values for gradient amplitudes $G_R$, $G_p$ and increases $dG_R/dt$, $dG_P/dt$ of the gradients Gr, Gp on the logical axes are determined depending on the received global maximum values $G_{x\_max}$, $G_{y\_max}$, dGx_max/dt, dGy_max/dt, and the angles $\Omega$ of the individual radial trajectories S of the pulse sequence P to be optimized.

The pulse sequence optimization processor 62 has an angle determining processor 62a that is configured to determine a best possible angle $\Omega_{best}$ of a radial k-space trajectory, at which the gradients Gr, Gp are destructively superimposed on the logical axes and optimally distributed on the physical axes x, y. This determination can be effected by calculation using an optimization method, for example. In the optimization method, first a functional dependency of the possible gradient amplitudes $G_R$, $G_p$ depending on the permitted physical restrictions, and the angle $\Omega$ of a respective trajectory S, are determined. Then a maximum of the determined function is determined, depending on the cited arguments, i.e. the permitted physical restrictions, e.g. maximum amplitude values $G_{x\_max}$, $G_{y\_max}$ and increases dGx_max/dt, dGy_max/dt of the gradients Gx, Gy in the direction of the physical axes, and the angle $\Omega$. The pulse sequence optimization processor 62 further has a gradient parameter determining processor 62b that, on the basis of the optimum angle $\Omega_{best}$ that has been determined, determines gradient amplitudes $G_R(\Omega_{best})$, $G_p(\Omega_{best})$ and increases $dG_R(\Omega_{best})/dt$, $dG_P(\Omega_{best})/dt$ of the gradients Gr, Gp on the logical axes for a radial k-space trajectory having the best possible angle $\Omega_{best}$. This determination can be made e.g. on the basis of a mathematical relationship of dependency between the gradients on the logical axes and the gradients on the physical axes, as embodied in the equations 1, 2. Furthermore, in a determining processor 62c parameters of logical gradients Gp, Gr are determined on the basis of the maximum amplitude values $G_{x\_max}$, $G_{y\_max}$ and increases $dGx\_max/dt$, $dGy\_max/dt$ of the gradients Gx, Gy in the direction of the physical axes. The processor 62c also determines the angle $\Omega$, individual gradient amplitudes $G_R$, $G_p$ and individual increases $dG_R/dt$, $dG_P/dt$ of the gradients Gr, Gp on the logical axes for the other radial k-space trajectories, depending on the respective angle $\Omega$ of the relevant k-space trajectory S. The gradient parameters $G_R$, $G_p$, $dG_R/dt$, $dG_P/dt$ and the maximum gradient amplitudes $G_R(\Omega_{best})$, $G_p(\Omega_{best})$ and increases $dG_R(\Omega_{best})/dt$, $dG_P(\Omega_{best})/dt$ that have been determined are then transferred from the pulse sequence optimization processor 62 to an output interface 63, which forwards the gradient parameters $G_R$, $G_p$, $dG_R/dt$, $dG_P/dt$, $G_R(\Omega_{best})$, $G_p(\Omega_{best})$, $dG_R(\Omega_{best})/dt$, $dG_P(\Omega_{best})/dt$ to units that are situated outside the pulse sequence optimization computer 60.

Figure 7:
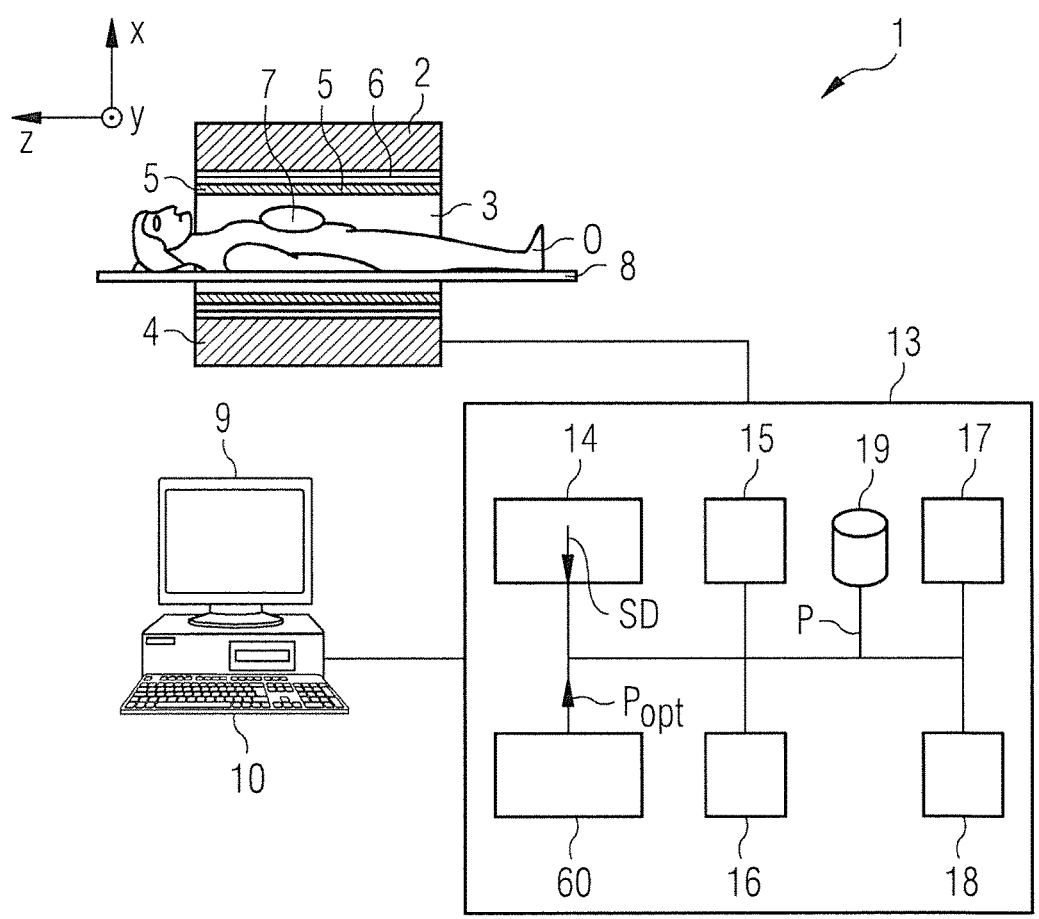
FIG. 7 shows a magnetic resonance imaging system according to an exemplary embodiment of the invention.

FIG. 7 shows a basic schematic illustration of a magnetic resonance installation 1 (subsequently abbreviated to "MR installation") according to the invention. This has the actual magnetic resonance scanner 2 with an examination space 3 or patient tunnel, into which an examination object O, in this case a patient or subject, in whose body the examination object (e.g. a specific organ) is located, can be moved on a couch 8.

The magnetic resonance scanner 2 is usually equipped with a basic field magnet 4, a gradient system 6, and an RF transmitting antenna system 5 and an RF receiving antenna system 7. In the exemplary embodiment illustrated, the RF transmitting antenna system 5 is a whole-body coil that is built into the magnetic resonance scanner 2, whereas the RF receiving antenna system 7 uses local coils (symbolized by a single local coil in FIG. 7) which are arranged on the patient or subject. It is generally possible for the whole-body coil to be used as an RF receiving antenna system and for the local coils to serve as an RF transmitting antenna system, provided these coils can be switched into different operating modes in each case.

The MR installation 1 also has a central control computer 13, which is used to control the MR installation 1. This central control computer 13 comprises a sequence controller 14 for controlling the pulse sequence. It is used to control the series of radio-frequency pulses (RF pulses) and gradient pulses depending on a selected imaging sequence. Such an imaging sequence can be specified in a measurement protocol or control protocol, for example. Various control protocols for different measurements are usually stored in a memory 19 and can be selected (and changed if necessary) by an operator and then used to perform the measurement. Before the control protocols are sent to the sequence controller 14, they are sent to a pulse sequence optimization computer 60 for optimization. The pulse sequence optimization computer 60 modifies gradient parameters in a protocol P that has been received, as explained in connection with FIG. 3 to FIG. 5, and sends the optimized control protocol $P_{opt}$ to the sequence controller 14 for the purpose of controlling the pulse sequence.

For emitting the individual RF pulses, the central control computer 13 has a radio-frequency transmitter 15 that generates and amplifies the RF pulses before feeding them into the RF transmitting antenna system 5 via a suitable interface (not illustrated in detail). The control computer 13 has a gradient system interface 16 for controlling the gradient coils of the gradient system 6. The sequence controller 14 communicates with the radio-frequency transmitting device 15 and the gradient system interface 16 in an appropriate manner, e.g. by transmitting sequence control data SD, for the purpose of transmitting the pulse sequences. The control computer 13 also has a radio-frequency receiving device 17 (which likewise communicates with the sequence computer 13 in an appropriate manner) for coordinated acquisition of magnetic resonance signals, i.e. raw data, received from the RF transmitting antenna system 7. A reconstruction computer 18 accepts the acquired raw data and reconstructs the MR image data therefrom. The image data can then be stored in a memory 19, for example.

The central control computer 13 can be operated via a terminal having an input unit 10 and a display unit 9, by which the entire MR installation 1 can be operated by an operator. The display unit 9 can also be used to display MR images, and the input unit 10 (possibly in combination with the display unit 9) can be used to plan and start measurements, and in particular to select and possibly to modify suitable control protocols with suitable measurement sequences as explained above.

The inventive MR installation 1 and in particular the control computer 13 may also have further components that are not illustrated in detail here but are usually present in such equipment, e.g. a network interface by which the entire installation can be connected to a network and raw data and/or image data or parameter charts, and further data such as e.g. patient-related data or control protocols, can be exchanged.

The manner in which raw data are acquired by applying RF pulses and generating gradient fields, and in which MR images can be reconstructed therefrom, are generally known to those skilled in the art and thus need not be explained in further detail herein. Likewise, a variety of measurement sequences such as GRE measurement sequences or TSE measurement sequences for generating dynamic or static pictures are generally known to those skilled in the art.

The method and the magnetic resonance imaging system have been explained herein primarily with reference to an application for recording medical image data. However, the invention is not limited to application in the medical field, and can in principle be applied to the recording of images for other purposes. Furthermore, the inventive magnetic resonance imaging method is described in connection with slice-based sampling of a region to be examined. It is again noted that the method described can also be applied analogously to three-dimensional sampling methods. Moreover, the use of the terms "computer" or "processor" herein do not require that the computer or processor be formed as a single component. Those terms also encompass multiple linked computers or processors, with the program code for performing the inventive procedure being distributed among those multiple components.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for determining a pulse sequence for magnetic resonance raw data acquisition, said method comprising:

in a processor, establishing a pulse sequence for operating a magnetic resonance data acquisition scanner to acquire raw magnetic resonance data, in which said raw magnetic resonance data are entered into k-space along radial trajectories in k-space according to readout gradients and phase gradients in said sequence, each of said readout gradient and phase gradients having an amplitude and an increase with respect to time in respective directions corresponding to physical axes of said scanner;

in said processor, setting the respective amplitudes and increases with respect to time of said readout gradients and phase gradients in said sequence, for individual sections of k-space, dependent on an orientation of the respective section in k-space and dependent on global maximum values of said amplitudes, and global maximum values of said increases with respect to time, on said physical axes; and making said pulse sequence available from said processor in electronic form in a format configured to operate said scanner.

2. A method as claimed in claim 1 comprising, in said processor, determining maximum possible values for said amplitudes and said increases with respect to time of said readout gradients and said phase gradients on logical axes.

3. A method as claimed in claim 1 wherein said pulse sequence comprises a plurality of data acquisition repetitions, and comprising establishing said sections in k-space so that each section contains multiple repetitions.

4. A method as claimed in claim 1 wherein said pulse sequence comprises a plurality of data acquisition repetitions, and comprising establishing said sections in k-space so that each section contains only one repetition.

5. A method as claimed in claim 1 wherein each radial trajectory in k-space proceeds at an angle from a center of k-space, and wherein said method comprises, in said processor:

determining a best possible angle of a radial k-space trajectory, at which said readout gradients and said phase gradients are destructively superimposed on logical axes and are optimally distributed on said physical axes;

identifying a radial k-space trajectory that has said best possible angle in k-space, and determining said amplitudes and increases with respect to time of said readout gradients and phase gradients for said radial k-space trajectory having said best possible angle; and determining respective amplitudes and increases with respect to time of said readout gradients and phase gradients on said logical axes for other radial k-space trajectories while not exceeding said global maximum values of said amplitudes and increases with respect to time.

6. A method as claimed in claim 5 wherein said pulse sequence comprises a plurality of data acquisition repetitions, and wherein said method comprises, in said processor:

determining the respective amplitudes and increases with respect to time of said readout gradients and phase gradients individually for respective radial k-space trajectories so that a respective radial k-space trajectory is fully sampled only for a repetition having said best possible angle, and with only a portion of the respective k-space trajectory being sampled for other repetitions having other trajectory angles that differ from said best possible angle.

7. A method as claimed in claim 6 comprising sampling only an inner rectangle in k-space for said other repetitions having said other trajectory angles that differ from said best possible angle.

8. A method as claimed in claim 6 wherein, for said other repetitions having said other trajectory angles that differ from said best possible angle, starting sampling in k-space at an end of an inner rectangle of k-space, and fully sampling a remainder of k-space along a direction of the respective k-space trajectory, and sampling adjacent k-space trajectories alternately in opposite directions.

9. A magnetic resonance imaging method comprising:

in a processor, establishing a pulse sequence for operating a magnetic resonance data acquisition scanner to acquire raw magnetic resonance data, in which said raw magnetic resonance data are entered into k-space along radial trajectories in k-space according to readout gradients and phase gradients in said sequence, each of said readout gradient and phase gradients having an amplitude and an increase with respect to time in respective directions corresponding to physical axes of said scanner;

in said processor, setting the respective amplitudes and increases with respect to time of said readout gradients and phase gradients in said sequence, for individual sections of k-space, dependent on an orientation of the respective section in k-space and dependent on global maximum values of said amplitudes, and said increases with respect to time, on said physical axes;

from said processor, operating said scanner with said pulse sequence to acquire said raw magnetic resonance data, and to enter the raw magnetic resonance data into k-space, according to said pulse sequence; and in a reconstruction computer, reconstructing image data from the acquired raw magnetic resonance data in k-space.

10. A method as claimed in claim 9 comprising reconstructing said image data using a partial Fourier transformation.

11. A magnetic resonance data acquisition pulse sequence optimization computer comprising:

a processor configured to establish a pulse sequence for operating a magnetic resonance data acquisition scanner to acquire raw magnetic resonance data, in which said raw magnetic resonance data are entered into k-space along radial trajectories in k-space according to readout gradients and phase gradients in said sequence, each of said readout gradient and phase gradients having an amplitude and an increase with respect to time in respective directions corresponding to physical axes of said scanner;

an input interface via which said processor is configured to receive inputs that electronically designate global maximum values of said amplitudes, and global maximum values of said increases with respect to time, of said readout gradients and said phase gradients;

said processor being configured to set the respective amplitudes and increases with respect to time of said readout gradients and phase gradients in said sequence, for individual sections of k-space, dependent on an orientation of the respective section in k-space and dependent on said global maximum values of said amplitudes, and said global maximum values of said increases with respect to time, on said physical axes; and an output interface adapted to communicate with said scanner, at which said processor is configured to make said pulse sequence available in electronic form in a format configured to operate said scanner.

12. A magnetic resonance imaging apparatus comprising:
a magnetic resonance data acquisition scanner;
a processor configured to establish a pulse sequence for operating said magnetic resonance data acquisition scanner to acquire raw magnetic resonance data, in which said raw magnetic resonance data are entered into k-space along radial trajectories in k-space according to readout gradients and phase gradients in said sequence, each of said readout gradient and phase gradients having an amplitude and an increase with respect to time in respective directions corresponding to physical axes of said scanner;

said processor being configured to set the respective amplitudes and increases with respect to time of said readout gradients and phase gradients in said sequence, for individual sections of k-space, dependent on an orientation of the respective section in k-space and dependent on global maximum values of said amplitudes, and said increases with respect to time, on said physical axes; and said processor being configured to operate said scanner according to said pulse sequence.

13. A non-transitory, computer-readable data storage medium encoded with programming instructions, said storage medium being loaded into a computer system of a magnetic resonance apparatus that comprises a magnetic resonance data acquisition scanner, said programming instructions causing said computer system to:

establish a pulse sequence for operating said magnetic resonance data acquisition scanner to acquire raw magnetic resonance data, in which said raw magnetic resonance data are entered into k-space along radial trajectories in k-space according to readout gradients and phase gradients in said sequence, each of said readout gradient and phase gradients having an amplitude and an increase with respect to time in respective directions corresponding to physical axes of said scanner;

set the respective amplitudes and increases with respect to time of said readout gradients and phase gradients in said sequence, for individual sections of k-space, dependent on an orientation of the respective section in k-space and dependent on global maximum values of said amplitudes, and said increases with respect to time, on said physical axes; and make said pulse sequence available from said computer system in electronic form in a format configured to operate said scanner.

* * * * *